US007739536B2

(12) United States Patent
Nguyen et al.

(10) Patent No.: US 7,739,536 B2

(45) Date of Patent: Jun. 15, 2010

(54) INTELLIGENT FREQUENCY AND VOLTAGE MARGINING

(75) Inventors: Vincent Nguyen, Houston, TX (US); David Engler, Cypress, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 376 days.

(21) Appl. No.: 11/065,883

(22) Filed: Feb. 25, 2005

(65) Prior Publication Data

US 2005/0235176 A1 Oct. 20, 2005

Related U.S. Application Data

(60) Provisional application No. 60/559,264, filed on Apr. 2, 2004.

(51) Int. Cl.
*G06F 1/08* (2006.01)

(52) U.S. Cl. ....................... 713/501; 713/500; 702/117; 702/118

(58) Field of Classification Search ................. 702/117, 702/118; 713/500, 501
See application file for complete search history.

(56) References Cited

U.S. PATENT DOCUMENTS

| | | | | |
|---|---|---|---|---|
| 6,351,827 | B1 * | 2/2002 | Co et al. | 714/42 |
| 6,535,986 | B1 * | 3/2003 | Rosno et al. | 713/400 |
| 6,697,952 | B1 * | 2/2004 | King | 713/300 |
| 6,792,379 | B2 * | 9/2004 | Ando | 702/130 |
| 6,925,616 | B2 * | 8/2005 | Noujeim et al. | 716/4 |
| 7,058,703 | B2 * | 6/2006 | Hawkins | 709/220 |
| 7,085,944 | B1 * | 8/2006 | Hamilton | 713/320 |
| 7,165,002 | B2 * | 1/2007 | Adler | 702/117 |

* cited by examiner

*Primary Examiner*—Thomas Lee
*Assistant Examiner*—Paul B Yanchus, III

(57) ABSTRACT

A system and method for voltage and frequency margining of a digital system such as a digital processing system. Various implementations of the present invention may be utilized to programmatically vary the voltage and or frequency utilized by one or more components within a processing system to effect changes in system and or component margining.

19 Claims, 3 Drawing Sheets

INTELLIGENT FREQUENCY AND VOLTAGE MARGINING

CROSS REFERENCE TO RELATED APPLICATIONS

This application claims the priority of provisional application Ser. No. 60/559,264 filed Apr. 2, 2004.

BACKGROUND

The present disclosure relates to computer systems and to methods and apparatuses for frequency and voltage margining. Given the high speed of today's microprocessors and related circuitry, the signal edge rates and system bus speeds have increased to the point that oscilloscope measurements may not offer a true indicator of signal quality present at an integrated circuit die. Typically, to accurately measure signal quality, a silicon die has to be exposed and probed by an oscilloscope. While oscilloscopes have been used for many years to make these types of waveform measurements, the very high speed of today's circuitry makes an accurate measurement by most oscilloscopes a very difficult and error prone process.

A number of issues combine that may make accurate oscilloscope measurements difficult. One such factor is the capacitance loading of an oscilloscope probe that, by it's very nature, changes the input impedance seen by a signal. This increase in capacitance may in fact modify the observed signal to such a degree that it is unreliable and does not accurately reflect the actual signal during normal operation of a circuit. Additionally, an oscilloscope probe may introduce inductance effects which like capacitance effects modify the observed signal waveform such that what is observed also may not accurately reflect a waveform of a circuit in actual operation without being probed.

To address these issues and to accurately measure signal quality of a silicon die, the silicon die typically has to be exposed and probed by expensive high speed test equipment. This may be a very time consuming and destructive process and therefore is one to be avoided if practical.

One reason for doing system margining, such as frequency and voltage margining, is to monitor in the production process components and systems that may have deviated from their specifications, or may have performance trends that require investigation to understand. Identifying and capturing these systems may improve the customer's experience with the related products and may reduce the cost in dealing with problems before products that may be problematic are introduced into the field.

Such margining testing may in fact be the only practical solution to proactively address and resolve process drift issues to prevent product holds that could become a major revenue impact to a company. Therefore, the ability to perform real time system margining may become an important part of the design and production phase of products in the future. The present invention may address one or more of the above issues.

BRIEF SUMMARY

In at least some embodiments, a system or method may comprise one or more devices that may be programmable to change frequency and/or voltage to one or more devices within a computer system. In at least some embodiments, an electronically variable resistor, such as a digital potentiometer, may be utilized to vary the voltage and/or frequency to the one or more components in the system.

BRIEF DESCRIPTION OF THE DRAWINGS

In accordance with embodiments of the present invention, reference will now be made to the accompanied drawings in which.

NOTATION AND NOMENCLATURE

Figure 1:
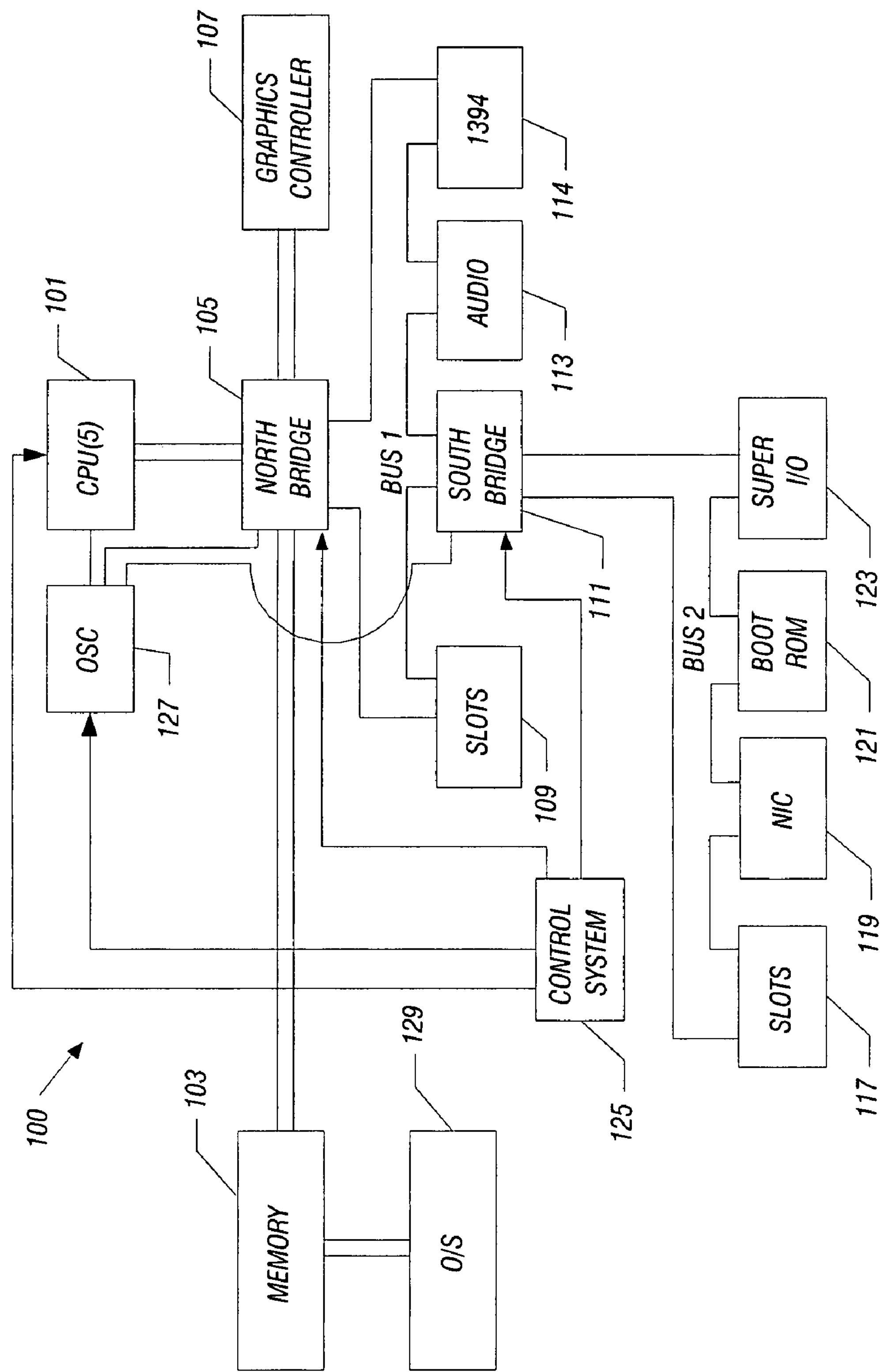
FIG. 1 illustrates a computer system in accordance with embodiments of the present invention.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "included" and "comprising" are used in an open-ended fashion, and thus should be interpreted to mean "including, but not limited to . . . ". Also, the term "couple" or "couples" is intended to mean either an indirect or direct electrical connection. Thus, if a first device couples to a second device, that connect may be through a direct electrical connection, or through an indirect electrical connection via other devices and connections. The terms assertion, asserting and the like mean the associated signal or line is in a logical active state. Further, all examples included herein should be construed as being open ended (i.e., not limiting in any way).

DETAILED DESCRIPTION

The following discussion is directed to various embodiments of the invention. Although one or more of these embodiments may be preferred, the embodiments disclosed should not be interpreted, or otherwise used, as limiting the scope of the disclosure. In addition, one skilled in the art will understand that the following description has broad application, and the discussion of any embodiment is meant only to be exemplary of that embodiment, and not intended to intimate that the scope of the disclosure is limited to that embodiment.

As will be disclosed below, various embodiments of the invention provide the ability to provide for voltage and/or frequency margining in a computer system. This frequency and voltage margining may provide a vehicle for engineers to intelligently and dynamically perform system margining. Additionally, embodiments of the present invention allow engineers to validate their design at a range of voltages and frequencies using a system management controller that may have a system management bus such as an I2C interface. I2C is an acronym for the Inter-IC bus that was developed by Phillips Corporation. This bus system provides for a number of peripheral ICs to communicate with each other and to other devices. An I2C bus is typically implemented as a bi-directional 2-wire bus that includes serial data and serial clock information. While the following embodiments may be described as using the I2C bus interconnect system, other interconnect systems may be advantageously utilized without departing from the spirit and scope of the invention as defined by the claims.

Using the combination of voltage and frequency margining, engineers or others may determine whether their design or selected components meet a particular specification. Additionally, the engineers may also determine the high and low side margins of a particular system and thereby determine if there is sufficient margin to accommodate for future process shifts that may incur inherently in the production of devices and systems. This ability to determine the system and component margining is particularly advantageous in the manufacturing of product by, for example, determining that the margins are in the center of the expected production shifts that may naturally occur in manufacture and therefore give the manufacturing entity some confidence that products may in fact meet at least the desired minimum specifications for performance.

Engineers may randomly select systems from production builds and quickly and easily put them under margining tests by, for example, varying the voltage or frequency to one or more of the devices in the system and collect the resulting data. The collected data from the device under tests of the production lot may then be compared with data that may have been established during the development cycle of the product. By comparing both data sets, engineers may effectively determine and predict the process drift that system components and overall systems may have and therefore may prevent defective systems from being introduced into the field. Although typically the system voltage levels and frequencies may be set to a nominal specified value in production, it may also be possible for a particular system to be adjusted either by changing the voltage and/or frequency to one or more devices such that the overall performance of the system meets a desired specification.

While a number of devices may be advantageously utilized to vary the voltage and/or frequency to the devices as will be described herein, one example of a useful device is the X9118 single digitally-controlled potentiometer made by Xicor, Incorporated of Milpitas, Calif. This device utilizes an $I^2C$ programmable interface to effectively vary the resistance of a emulated potentiometer within the device. The application of this device with respect to embodiments of the present invention will be discussed below.

Referring now to FIG. 1, a computer system 100 may include one or more central processing units 101 or other processing devices, one or more memory devices 103, and a bridge device such as a north bridge 105. The north bridge 105 may be coupled to a graphics controller 107 that may, in some embodiments, be connected to the north bridge 105 through a bus such as an advanced graphics port, AGP (bus).

Additionally, north bridge 105 may be coupled through bus 1 to plug-in slots 109 that may be utilized, in some embodiments, to expand the computer resources. Additionally, north bridge 105 may be coupled through bus 1 to a second bridge device such as a south bridge 111. North bridge 105 may also be coupled through bus 1 to various peripheral devices such as an audio section 113, and IEEE1394 interface device 114, or other devices. South bridge 111 may be coupled through bus 2 to devices such as expansion slots 117, network interface control 119, a boot ROM 121, a super IO interface 123, or other such devices. The north bridge 105 and the south bridge 111 may be Peripheral Connect Interface ("PCI"), Peripheral Connect Interface Express ("PCI-X"), memory bus or other bus controllers in some embodiments.

Additionally, a control system 125 may be coupled to interface with an oscillator 127 that may be coupled to the CPU(s) 101 and other devices. The oscillator 127 may be a voltage controlled oscillator, a frequency synthesizer or other fixed or variable frequency source. Additionally, control system 125 may be coupled to the north bridge 105, south bridge 111 and CPU(s) 101 such that control system 125 may be operational to change either or both the frequency and voltage utilized by those and other components. Of course, other architectures and variations of this architecture may be utilized to achieve a similar function.

Bus 1 and bus 2 may be implemented in any suitable bus architecture, for example, a peripheral interconnect interface bus (PCI) or other interface bus. Memory 103 may contain code such as an operating system 129, that may be utilized by CPU(s) 101 or other CPU to control one or more functions of the computer system 100.

Figure 2:
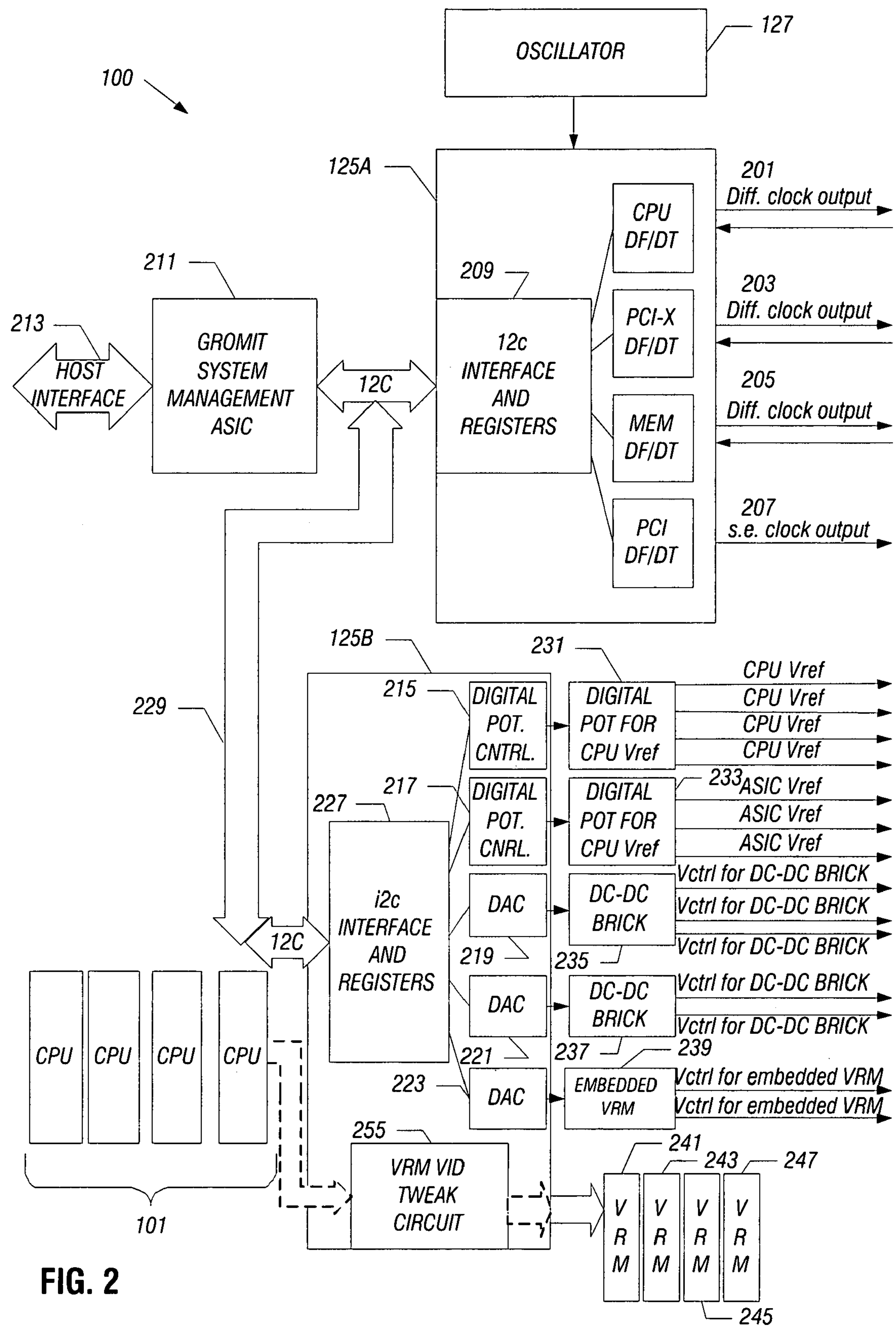
FIG. 2 illustrates a voltage and frequency margining system utilizing a plurality of integrated frequency and/or voltage margining devices.

Referring now to FIG. 2, a more detailed section of computer system 100 is illustrated. The control system 125 of FIG. 1 may in fact be implemented as two separate components in some embodiments such as 125*a* and 125*b*. Control system 125*a* may be implemented to take as an input the output of oscillator 127 and to provide multiple outputs 201 through 207 that, in some embodiments, may each have variable frequency outputs. The control system 125*a* may vary the output from oscillator 127 such that output 201 is different from the output of oscillator 127. For example, one or more of the outputs 201-207 may be an output from a frequency synthesizer that outputs a frequency either a higher or lower frequency than the output of oscillator 127. Also, in some embodiments, one or more of the outputs 201-207 may have a duty cycle that is different from the duty cycle of the output of oscillator 127.

The outputs 201 through 207 may provide an output that will be utilized by north bridge 105, south bridge 111, memory 103 or as bus 1 and/or bus 2 as illustrated in FIG. 1. In addition, control system 125*a* may have other outputs similar to outputs 201 through 207 to provide for the varying of oscillator output 127 to devices in processor-based system 100.

Control system 125*a* may also include an I2C interface 209 that may, in some embodiments, be connected to a system management application specific integrated circuit "ASIC" such as a Gromit ASIC provided by the Hewlett Packard Company of Palo Alto, Calif. The system management ASIC 211 may in turn be connected by a bus 213 to a bus of system of 100 or to the bus of a dedicated controller not illustrated. The I2C interface 209 provides a convenient control means to effect changes in the outputs 201 through 207 by sending data to the I2C interface from a bus of system 100 or another system. The system management ASIC 211 may be considered a system management controller and may serve to send commands to programmable devices including, but not limited to, devices 125, 125A, 125B and 301-311.

Control system 125*a* may modify the output of the oscillator 127 as provided on outputs 201 through 207. This modification may be achieved changing the output of a voltage controlled oscillator, the output of a frequency synthesizer, or the output of some other frequency source. In some embodiments, the actual output of oscillator 127 may be varied which provides a change in the frequency of the outputs 201-207.

Control system 125*b* in some embodiments, may provide for the variation of voltages to various components in system 100. Control system 125*b* may include digital potentiometer controls 215 and 217, and multiple digital to analog converters 219 through 223 and, a voltage reference module tweak circuit 225. Additionally, control system 125*b* may include an I2C interface 227 that may be coupled to an I2C bus 229.

Either internal or external to control system 125*b*, may be, in some embodiments, digital potentiometers 231 and 233, and DC-to-DC converters "bricks" 235 and 237. In some embodiments, control system 125 may also control either internal to 125*b* or external to control system 125*b* an embedded digital voltage reference module 239. The voltage reference module tweak circuit 225 may be coupled to voltage reference modules 241 through 247. The voltage reference modules 241-247 may in turn be coupled to CPU(s) 101 as is known in the art.

Control system 125*b* may be operative such that commands received on I2C bus 229 may be utilized by the control system 125*b* to vary one or more of the inputs of the digital potentiometers 231, 233, DC-to-DC converters 235, 237, the embedded digital voltage reference module 239 and/or one or more of the voltage reference modules 241 through 247.

The embodiment illustrated in FIG. 2 may therefore be utilized to vary either or both the frequency going through the various components of system 100 or the voltages going to various components of system 100 through programming via, in some embodiments, the I2C bus 229. As was described previously, by varying the voltage and the frequencies to one or more of the components of system 100, voltage and frequency margining may therefore effected to achieve the advantageous results previously described. This system may provide engineers or others with a very convenient method of system margining during product production, the product design phase, or for other purposes.

In operation, in some embodiments, an engineer or other individual or system may program the control system 125*a* and/or 125*b* to incrementally adjust the frequency and voltage to specified limits. Individual components such as CPU(s), north bridge and south bridge components, and other components typically use a reference voltage to compare levels of input signals. By controlling the output voltages presented to the components, the voltage reference used by these components may be dynamically controlled by a digital potentiometer such as the digital potentiometers 231-233. Additionally, by varying the output of digital to analog converters such as 219-223, the outputs from DC to DC converters such as 235 and 237 may be varied and the output from an embedded voltage reference module such as 239 may be varied. Similarly, the system power supplies such as voltage reference modules 241 through 247 may be varied by the VRM tweak circuit 225 to incrementally change the voltage presented to the CPU(s) 101. In this manner, the voltage and frequencies presented to the components may be incrementally varied in a known and controlled manner.

Figure 3:
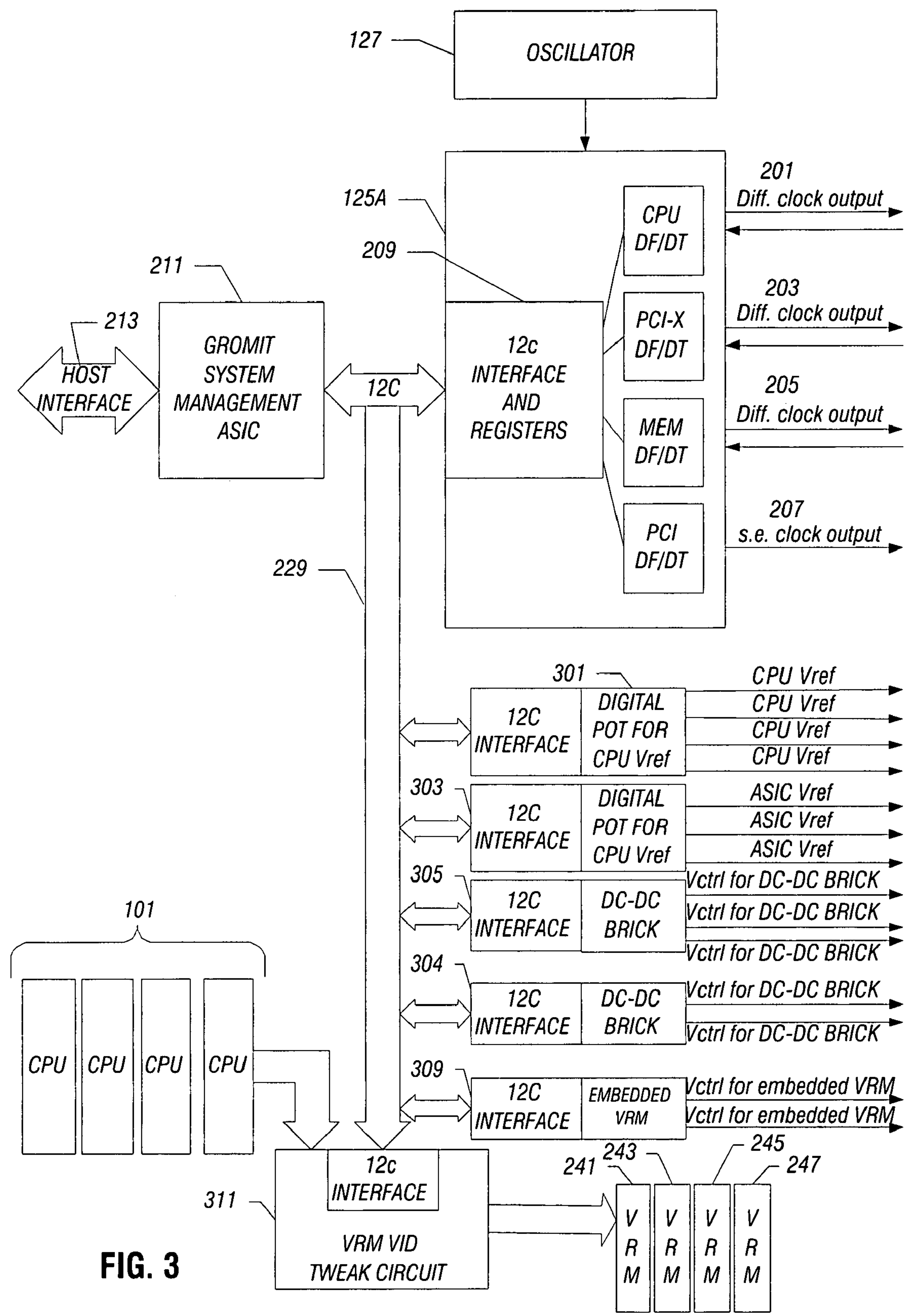
FIG. 3 illustrates a computer system using a frequency and voltage margining system that utilizes discrete and integrated margining devices.

Referring now to FIG. 3, the operation of like numbered components are as previously described for those components. Additionally, the functionality of control system 125*b* has been split, in this embodiment, into discrete components each having a programmable interface such as an I2C interface.

Digital potentiometer system block 301 may include an I2C interface and a digital potentiometer that may function to vary the voltage reference to one or more CPU(s) 101. Similarly, digital potentiometer system block 303 may include an I2C interface and a digital potentiometer that may operate to change the voltage reference utilized by one or more application specific integrated circuits utilized by system 100. DC-to-DC converter brick systems 305 and 307 may include an I2C interface and be operative to programmatically change the voltage control utilized by one or more DC-to-DC converters that may be employed within system 100. Additionally, an embedded digital voltage reference module system 309 may include an I2C interface and be operative to vary the voltage control for embedded voltage reference modules that may be utilized by one or more components in system 100. Lastly, in this embodiment, voltage reference module tweak circuit system 311 may include an I2C interface and be operative to vary the input to one or more of the voltage reference modules 241 through 247. The voltage reference modules 241 through 247 may be coupled to one or more CPU(s) 101 as is known in the art.

In a similar manner as was described in association with the embodiment illustrated in FIG. 2, the embodiment illustrated in FIG. 3 may be programmatically controlled through the I2C bus to vary either or both the frequency and voltage utilized by one or more of the components of system 100. In this manner, voltage and frequency margining of the system 100 may be affected for the advantageous purposes previously described.

Generally, the advantage of implementing discrete components such as 125*a* and 125*b* is that the components may be located physically close to a particular device or devices being marginalized that may be sensitive to electrical noise. However, the implementation of multiple discrete margining components may be more costly than fewer more integrated devices.

The results of varying the margins of various system components may be monitored by noting the failure limits of one or more devices. In addition, the results may be monitored by electronic means coupled to one or more of the system components having an operating parameter being varied. Other monitoring means may also be utilized as needed or useful.

While embodiments of the invention have been described herein, other variations will be appreciated by those skilled in the art. For example, control system 125*a* instead of being an integrated system may in fact be discrete components each being programmatically controlled to effect a frequency variation to one or more of the components of system 100. Therefore, the above discussion is meant to be illustrative of the principals and various embodiments of the present invention. Numerous variations and modifications will become apparent to those skilled in the art once the above disclosure is fully appreciated. It is intended, therefore, that the following claims be interpreted to embrace all such variations and modifications.

What is claimed is:

1. A processor-based system comprising:

an electrical component installed in the processor-based system for operation in the processor-based system;

a first programmable circuit utilizing a frequency input and having a variable frequency output;

a second programmable circuit utilizing a voltage input and having a variable voltage output; and wherein, in response to a command from a system management controller, the first programmable circuit is operative to vary the frequency over a predefined range to the electrical component while the electrical component is operating in the processor-based system to determine a frequency margin associated with the processor-based system.

2. The system as in claim 1 wherein, in response to a command from the system management controller, the second programmable circuit is operative to vary the voltage output over a predefined range to the electrical component while the electrical component is operating in the processor-based system to determine a voltage margin of the processor-based system.

3. The system as in claim 2 wherein the system management controller sends commands to either the first or the second programmable circuit utilizing a bi-directional bus.

4. The system as in claim 1 wherein the first programmable circuit is coupled to a bus controller.

5. The system as in claim 4 wherein the first programmable circuit is coupled to a PCI bus controller.

6. The system as in claim 2 wherein the second programmable circuit is coupled to a voltage reference module.

7. The system as in claim 6 wherein the second programmable circuit is coupled to a CPU.

8. The system as in claim 2 wherein the second programmable circuit controls a digital potentiometer.

9. A processor-based method for use in a processor-based system, comprising:

a control device receiving a program input;

the control device changing a frequency output in response to the program input;

the control device changing a voltage output in response to the program input;

providing a first electrical component installed in the processor-based system, the first electrical component utilizing the changed frequency output as an input while operating in the processor-based system;

providing a second electrical component installed in the processor-based system, the second electrical component utilizing the changed voltage output as an input while operating in the processor-based system;

monitoring a response of the processor-based system to the changed frequency output;

determining a frequency margin of the first electrical component based on the monitored response;

monitoring a response of the processor-based system to the changed voltage output; and determining a voltage margin of the second electrical component based on the monitored response.

10. The method as in claim 9 further comprising the control device sending a command to a first circuit and the first circuit changing a frequency output in response to receiving the command.

11. The method as in claim 10 further comprising the control device sending the command to the first circuit utilizing a bi-directional bus.

12. The method as in claim 9 further comprising the first circuit changing the frequency of a bus coupled to the first circuit.

13. The method as in claim 12 further comprising the first circuit changes the frequency of a PCI bus coupled to the first circuit.

14. The method as in claim 9 further comprising the control device sending a command to a second circuit and the second circuit changing a voltage output in response to the command.

15. The method as in claim 14 further comprising the control device changing the voltage to a CPU coupled to the second circuit.

16. The system as in claim 1 wherein the first programmable circuit has a plurality of variable frequency outputs, and wherein, in response to a command from the system management controller, the first programmable circuit varies the plurality of frequency outputs to a plurality of electrical components while operating in the processor-based system to determine a frequency margin associated with each of the electrical components.

17. The system as in claim 16 wherein each of the plurality of frequency outputs has a different frequency.

18. The system as in claim 2 wherein the second programmable circuit has a plurality of variable voltage outputs and wherein, in response to a command from the system management controller, the second programmable circuit varies the plurality of voltage outputs to a plurality of electrical components while operating in the processor-based system to determine a voltage margin associated with each of the devices.

19. The system as in claim 18 wherein each of the voltage outputs has a different voltage.

* * * * *